United States Patent [19]
Sakaguchi et al.

[11] Patent Number: 5,990,615
[45] Date of Patent: Nov. 23, 1999

[54] ORGANIC ELECTROLUMINESCENT DISPLAY WITH PROTECTIVE LAYER ON CATHODE AND AN INERT MEDIUM

[75] Inventors: Yoshikazu Sakaguchi; Masako Kimura, both of Tokyo, Japan

[73] Assignee: NEC Corporation, Tokyo, Japan

[21] Appl. No.: 09/017,681

[22] Filed: Feb. 3, 1998

[30] Foreign Application Priority Data

Feb. 3, 1997 [JP] Japan ..................................... 9-020601

[51] Int. Cl.$^6$ ........................................................ H01J 1/62
[52] U.S. Cl. ............................................. 313/504; 313/509
[58] Field of Search ..................................... 313/503, 504, 313/506, 509, 512, 498

[56] References Cited

U.S. PATENT DOCUMENTS

| | | | |
|---|---|---|---|
| 4,213,074 | 7/1980 | Kawwaguchi et al. | 313/509 |
| 4,357,557 | 11/1982 | Inohara et al. | 313/509 |
| 4,810,931 | 3/1989 | McKenna et al. | 313/509 |
| 5,239,228 | 8/1993 | Taniguchi et al. | 313/509 |

FOREIGN PATENT DOCUMENTS

| | | |
|---|---|---|
| 5-41281 | 2/1993 | Japan . |
| 5-114486 | 5/1993 | Japan . |

*Primary Examiner*—Vip Patel
*Assistant Examiner*—Matthew J. Gerike
*Attorney, Agent, or Firm*—Young & Thompson

[57] ABSTRACT

In an organic EL element having a cap sealing structure, a cathode is coated with an insulative protecting layer of a fluorine system polymer or an oxide insulative material and an inert medium is filled within the cap sealing structure.

9 Claims, 2 Drawing Sheets

ORGANIC ELECTROLUMINESCENT DISPLAY WITH PROTECTIVE LAYER ON CATHODE AND AN INERT MEDIUM

BACKGROUND OF THE INVENTION

1. Field of the Invention

This invention relates to an organic electroluminescent (EL) element, more specifically to an organic EL element with an improved sealing structure.

2. Prior Art

An organic EL element is a current-driving type luminescent element and a large current must be flown between an anode and a cathode. As the result, the element becomes hot when light is emitted. When oxygen or moisture exists around the element during electroluminescence, oxidation is promoted to deteriorate the element. Main defect caused by deterioration due to oxygen and moisture is to generate a non-luminescent point so-called dark spot which is caused by change of properties of the organic material or peel off of the cathode. The dark spot grows up little by little accompanying with deterioration and becomes not to emit light. To prevent the above-mentioned deterioration, various proposals have been made.

In Japanese Laid-Open Patent Application No. 41281/1997, as a method for removing water component, an EL element is holded in an inactive liquid of a fluorocarbon oil containing a dehydrating agent such as a synthetic zeolite, etc.

In Japanese Laid-Open Patent Application No. 114486/1997, a fluorocarbon oil 12a as a heat emission layer is sealed with a sealing glass 9 on at least one of a cathode 2 and an anode 7 as shown in FIG. 5 so as to emit Jourl heat during its operation.

Further, as shown in FIG. 6, it has been known a method of preventing permeation of oxygen or water by providing a seal protective layer 8 of a carbonate compound.

According to the foregoing prior art, however, dark spots generate and grow in many cases due to dissolved oxygen or dissolved water contained in the fluorocarbon oil itself. Also, since a large amount of a dehydrating agent must be added to a sealing member, the element is tended to be damaged thereby, and water taken in the dehydrating agent proceeds oxidation of the element due to direct contact therewith. Thus, it is difficult to suppress formation and growth of dark spots. Also, when sealing is performed by a resin or a metal layer alone, it is difficult to completely prevent permeation of oxygen or water from outside so that an element having a long lifetime of several thousands to several ten thousands hours needed for a final product can hardly be obtained.

SUMMARY OF THE INVENTION

The present invention has been made to overcome the above problems and an object thereof is to provide a method of sealing an organic EL element which can prevent or control occurrence and grown up of dark spot of the organic EL element, and an organic EL element in which grown up of dark spot hardly occurs.

An organic EL element of the present invention comprises, in an organic EL element in which a sealing portion having a cap structure is provided at the outside the element, an insulative protecting layer is provided on a cathode, and an inert medium comprising an inert gas or an inert liquid such as carbon fluoride is filled in the cap structure. As the insulative protecting layer, a polymer of fluoride system or insulative oxide can be used.

As a measure for heat dissipation, the present invention comprises to form a sealing member with a metal having good thermal conductivity such as stainless steel or to provide a heat dissipation plate or heat dissipation net in the sealing member so as to cover the element whereby dissipating heat from the sealing member to outside, or else to connect a heat dissipation plate or heat dissipation net to a heat sink which is provided outside the sealing member whereby promoting dissipation of heat.

The present invention further comprises an element in which an oxygen absorber or a dehydrating agent is provided in a sheet state or a solid state at the opposed side of a sealing member of the element so as not to contact with the element.

DESCRIPTION OF THE PREFERRED EMBODIMENTS

Figure 1:
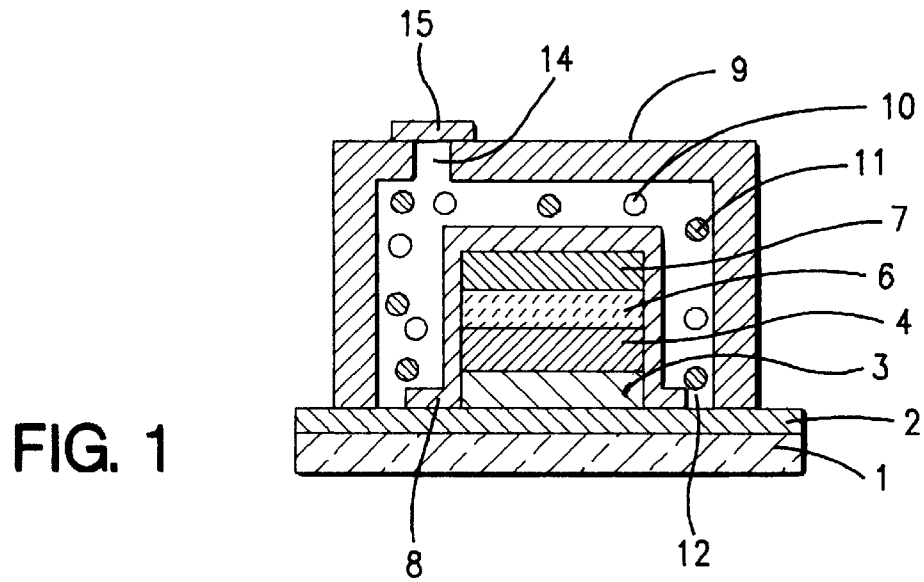
FIG. 1 is a sectional view of an organic EL element according to the first embodiment of the present invention.

Referring to FIG. 1, a transparent anode layer 2 of indium tin oxide (ITO) is formed on a glass substrate 1 by using a sputtering method, and a hole injection-transport layer 3, a light emission layer 4, an electron transport layer 6 and a cathode 7 are subsequently formed on the anode layer 2 by using vacuum deposition method.

As an insulative protecting layer 8 for the organic EL element, oxide insulator such as SiO, MgO or $Al_2O_3$ is deposited on the cathode 7 by a vacuum deposition method with a thickness of 10 nm to 100 nm so as to cover all of upper surface of the cathode 7 and side surfaces of its laminated body, including from the hole injection-transport layer 3 to the cathode 7. Deposition is carried out by a resistance heating method or an electron beam heating method to form the protecting layer 8. A vacuum degree at deposition is $1\times10^{-3}$ Pa or less, preferably $5\times10^{-4}$ Pa or less, and a vacuum rate and a substrate temperature are controlled to 50 to 200 nm/sec and 100° C. or lower, respectively.

As for the protecting layer 8, which can be deposited by a vacuum deposition method using at least one kind of a polymer of fluorine system such as polytetrafluoroethylene (PTFE), polychlorotrifluoroethylene (PCTFE), polyvinyliden fluoride (PVDF), etc. as a deposition source. At this time, the form of the deposition source compound may be powder, pellets or granules. An average molecular weight of the protecting layer 8 on the organic EL element at deposition is desirably 2000 to 400,000. The vacuum deposition is carried out by a resistance heating method or an electron beam heating method. A vacuum degree at deposition is $1\times10^{-3}$ Pa or less, preferably $4\times10^{-4}$ Pa or less, and a vacuum rate and a substrate temperature are made to 30 nm/sec and 100° C. or lower, respectively, to form the protecting layer 8 with a thickness of 10 to 500 nm. Whereas the organic EL material has generally not so good heat resistance, deterioration of characteristics of the organic EL material or peeling off of the organic layer or the cathode thin film can be prevented by controlling the substrate temperature and deposition rate when depositing the protecting film 8. The protecting film 8 thus deposited becomes a thin film having high moisture resistance and electrical insulating properties, and has no pin hole.

As a method of sealing the thus prepared EL element body, a sealing member 9 having a cap structure is provided at peripheral portion of the element, and an inert liquid 12 comprising a fluorocarbon such as a perfluoroalkane or perfluoroamine with which a dehydrating agent 10 and/or an oxygen absorber 11 is/are mixed is filled therein (FIG. 1). The sealing member 9 can be made of metal or glass.

When an inert liquid such as a perfluoroalkane or perfluoroamine is used for preparing a filling agent, these liquids are subjected to degassification and dehydration operations by heating in a vacuum oven once to several times, and then subjected to deoxidation and dehydration operation by filtering through a column with which stlica gel, molecular sieve, Fe or ascorbic acid is filled, and then used. Then, the filling agent is prepared by dispersing in the inert liquid each one kind or several kinds of an oxygen absorber such as granular ascorbic acid having a volume center particle size of 10 to 100 μm, a salt or oxide containing Fe, Ti or ions thereof, and a dehydrating agent such as granular silica gel, molecular sieve, diatomaceous earth, active alumina, zeolite, etc. each having a volume center particle size of 10 to 100 μm in an amount of 30 to 60% by weight based on the amount of the liquid.

For injecting the filling agent, an injection port 14 with a diameter of 1 to 2 mm is provided at the roof side of the sealing member 9, and after adhering the sealing member 9 onto the anode 2 and the glass substrate 1, the filling agent is injected by using a syringe or a pipet through the injection port 14. Then, the injection port is sealed by using a lid 15 having a slightly larger size than that of the injection port and comprising the same material as that of the sealing member 9 with an adhesive of epoxy resin system.

Figure 2:
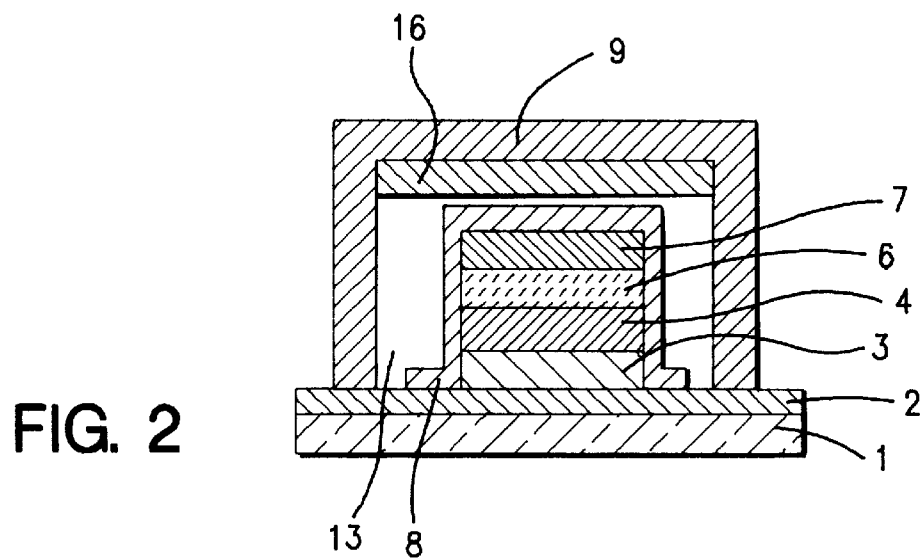
FIG. 2 is a sectional view of an organic EL element according to the second embodiment of the present invention.

Referring to FIG. 2, an innert gas 13 such as argon helium or nitrogen is filled within the sealing member 9. And a dehydration and oxygen absorber member 16 are adhered and retained at the roof side of the sealing member 9 by using an adhesive such as an epoxy resin, etc. The dehydration and oxygen absorber member can be prepared by carrying or dispersing the above-mentioned oxyten absorber or dehydration agent onto nonwoven fabric, a polymer film such as polyester, polyethylene, PVA, etc. to form a sheet or further laminating two or more sheets, or the above material is calcined to form a solid state material. By forming the absorbing member 16, not only remained oxygen or moisture can be removed but also a minute amount of oxygen or water penetrating into the element from outside through a portion such as adhesive interface, etc. after sealing can be removed. Needless to say, such absorber member 16 can be applied to the structure shown in FIG. 1.

Prior to filling the inert gas, the absorber member 16 is prepaired. Firstly an oxygen absorber such as granular ascorbic acid having a volume center particle size of 10 to 500 μm, a salt or oxide containing Fe, Ti or ions thereof, and a dehydration agent such as granular silica gel, molecular sieve, diatomaceous earch, active alumina, zeolite, etc. each having a volume center particle size of 10 to 500 μm is/are carried on or dispersed in a nonwoven fabric or a polymer film such as polyester, polyethylene, PVA, etc. to prepare an absorber sheet. Then, the sheet or laminated sheets in which two or more of the sheets are laminated, or a solid state material in which the above material is calcined is attached and retained to the roof side of the sealing cap by using an adhesive such as an epoxy resin, etc. whereby sealing of the EL element is carried out.

As shown in FIG. 2, by retaining the above-mentioned oxygen absorber and dehydration agent at the roof side of the sealing member, it can be prevented to contact them directly with the element.

For filling and sealing the inert gas, an opening may be provided to a sealing member 9 to fill the inert gas as shown FIG. 1, it is preferred to carry out sealing in a glove compartment flowing argon or nitrogen since sealing can be carried out without contacting with air and it is effective for preventing a dark spot.

Figure 3:
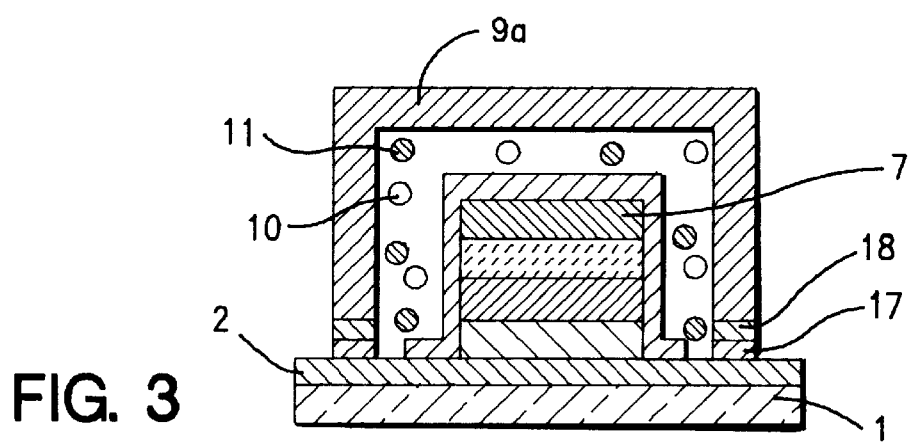
FIG. 3 is a sectional view of an organic EL element according to the third embodiment of the present invention.

For adhering the sealing member and the element substrate, an epoxy series photocurable adhesive 17 having little gas or water permeability is preferably used since heat resistance of the organic EL element is 100 to 150° C. and it is difficult to use a thermosetting adhesive as shown in FIG. 3.

Referring to FIG. 3, when stainless steel or Fe-based Ni alloy is employed for a sealing cap 9a, efficiency of heat dissipation becomes good but there are problem of adhesive strength with a glass substrate and thermal expansion. A low melting point glass 18 is welded to these metals, and the glass portion and the glass substrate of the EL element are adhered with the above-mentioned epoxy adhesive 17. According to this constitution, difference in coefficients of thermal expansion between the metal and the glass can be relaxed.

Figure 4:
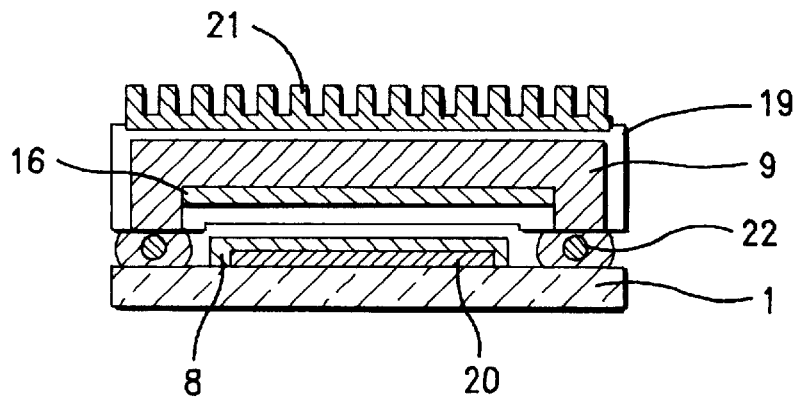
FIG. 4 is a sectional view of an organic EL element according to the fourth embodiment of the present invention.
Figure 5:
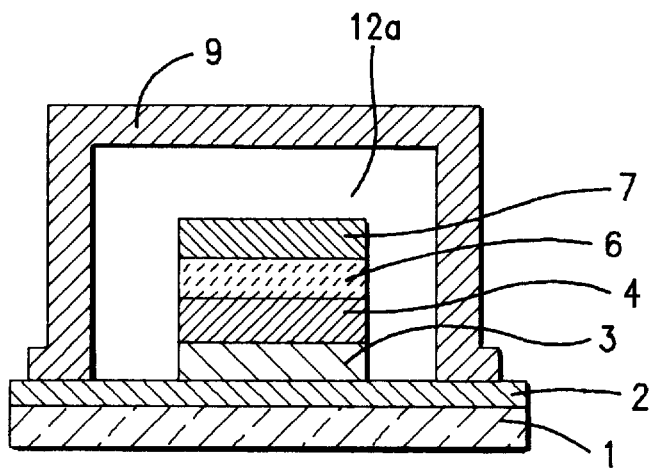
FIG. 5 is a sectional view of a prior art organic EL element.
Figure 6:
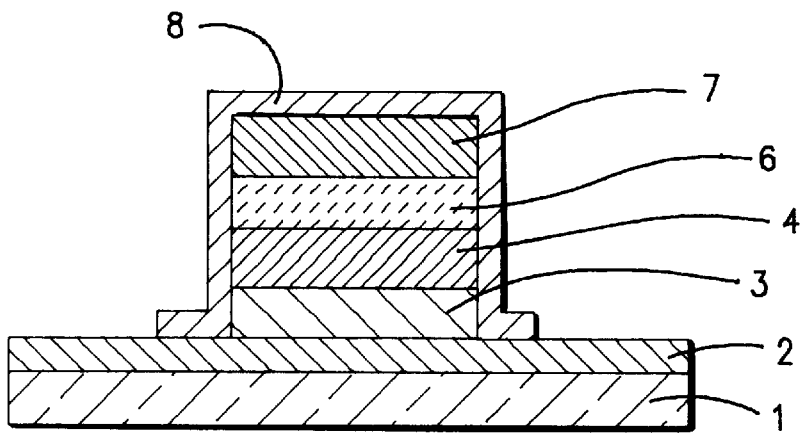
FIG. 6 is a sectional view of an another prior art organic EL element.

As is shown in FIG. 4, a heat dissipation plate or a heat dissiption net 19 made of a non-corrosive metal such as stainless steel is provided so as to cover directly above an organic thin film 20 coated with the protecting layer 8 and the heat dissipation material is take out outside the cap to avoid accumulation of heat generated during operating of the element. The above-mentioned heat dissipation plate or the heat dissipation net is connected to a heat sink 21 provided at the upper portion of the cap, etc., and then heat dissipation effect can be increased and lifetime of the element can be elongated.

EXAMPLE 1

On a glass plate 1 having a thickness of 1.1 mm, ITO layer was formed as a transparent anode electrode 2, and then α-NPD (diamine compound) was vacuum deposited thereon with a thickness of 500 angstrom as a hole injection-transport layer 3. Then, aluminum-quinoline complex and quinacridone as a dopant were codeposited thereon with a thickness of 250 angstrom as a luminescent layer 4, subsequently aluminum-quinoline complex was deposited with a thickness of 300 angstrom as an electron transport layer 6. Next, AlLi was codeposited with a thickness of 300 angstrom and then aluminum alone was deposited with a thickness of 1700 angstrom to form a cathode whereby an organic EL element was prepared. As for the cathode, Mg:Ag may be codeposited instead of Al:Li.

As a protecting layer of the organic EL element, silicon monoxide (SiO) was formed by vacuum deposition with a thickness of 30 nm so as to cover whose surfaces of the organic thin film and the cathode. Deposition was carried out by the resistance heating method, and film was formed at a vacuum degree before deposition of $4 \times 10^{-4}$ Pa, a deposition rate of 200 nm/sec and a substrate temperature of 60° C. or lower.

The thus prepared element was covered by a glass cap 9 as shown in FIG. 2, and nitrogen was sealed therein.

At the time of sealing a nitrogen gas, one layer of a sheet in which granular ascorbic acid with a volume center particle size of 100 um as an oxygen absorber and granular silica gel with a volume center particle size of 500 μm as a dehydrating agent were dispersed in a polyester resin was retained at the roof side of the sealing member to effect sealing of the EL element. An epoxy series photocurable adhesive was used as an adhesive.

When the EL element was allowed to stand at a temperature of 25° C. and a relative humidity of 50 to 70%, no non-luminescent point (dark spot) which can be admitted with eyes occurred after 3500 hours. With the element was connected a constant current electric source, and the element was driven by setting an electric current value to an initial luminance of 300 cd/cm$^2$, a time in which the luminance becomes a half of the initial value was about 3000 hours.

EXAMPLE 2

An organic EL element was prepared in the same manner as in Example 1, and a protecting layer was formed on the cathode by the vacuum deposition method using granular PCTFE as a deposition source. Vacuum deposition was carried out at a vacuum degree before deposition of $4\times10^{-4}$ Pa, a deposition rate of 30 nm/sec and a substrate temperature of 70° C. or lower so that a formed film has a film thickness of 100 nm and an average molecular weight of about 4000 to 20000.

To the sealing member of this element made of stainless steel was welded with a low melting point glass, and the glass portion and the glass substrate of the EL element were adhered by an epoxy resin. Perfluoroamine was filled therein. As the perfluoroamine, fluorinate FC-70 (trade name, available from Sumitomo 3M, Japan boiling point: 215° C.) was used by subjecting to heating, degassification and dehydration operations each three times in a vacuum oven and then filtering through Molecular sieve.

For sealing the inert liquid, granular ferrous oxyde having a volume center particle size of 60 μm as an oxygen absorber and granular Molecular sieve having a volume center particle size of 100 μm as a dehydrating agent were added to the liquid in an amount of 40% by weight and the liquid was sealed.

When the EL element was allowed to stand at a temperature of 25° C. and a relative humidity of 50 to 70%, no non-luminescent point (dark spot) which can be admitted with eyes occurred after 3500 hours. With the element was connected a constant current electric source, and the element was driven by setting an electric current value to an initial luminance of 300 cd/cm$^2$, a time in which the luminance becomes a half of the initial value was about 3000 hours.

EXAMPLE 3

An organic EL element was prepared in the same manner as in Example 1, and a protective layer was formed so as to cover the organic thin film and the cathode by the vacuum deposition method using SiO as a deposition source with a thickness of 30 nm. Vacuum deposition was carried out at a vacuum degree before deposition of $4\times10^{-4}$ Pa, a deposition rate of 200 nm/sec and a substrate temperature of 60° C. or lower.

For effecting sealing the above element with a sealing member having a cap structure and made of a glass, a heat dissipation net made of a stainless steel was so provided as to cover directly over the element in the sealing member as shown in FIG. 4. This was taken out outside the sealing member and connected to a heat sink provided at the upper portion of the sealing member. When the element substrate and the glass cap are adhered, by providing a spacer 22 with a particle size of 200 to 300 μm between the element substrate and the heat dissipation net, the organic EL element and the dissipation net are made to have a certain distance therebetween. In the sealing cap 9, an argon gas was sealed. For sealing an argon gas, a layer of a sheet in which granular ferrous oxide having a volume center particle size of 100 μm as an oxygen absorber and granular silica gel having a volume center particle size of 500 μm as a dehydrating agent were dispersed in a polyester resin was retained at the roof side of the sealing cap to perform sealing of the EL element.

When the EL element was allowed to stand at a temperature of 25° C. and a relative humidity of 50 to 70%, no non-luminescent point (dark spot) which can be admitted with eyes occurred after 3500 hours. With the element was connected a constant current electric source, and the element was driven by setting an electric current value to an initial luminance of 300 cd/cm$^2$, the luminance was not decreased to a half of the initial value even after about 3500 hours.

In contrast to the above Examples, an element was prepared as a comparative example by using a glass cap and sealing a nitrogen gas therein without providing a protective layer. When this element was allowed to stand at a temperature of 25° C. and a relative humidity of 50 to 70%, non-luminescent point (dark spot) which can be admitted with eyes can be admitted after 2000 hours.

With the element was connected a constant current electric source, and the element was driven by setting an electric current value to an initial luminance of 300 cd/cm$^2$, a time in which the luminance becomes a half of the initial value was about 1600 hours.

As described above, according to the present invention, by providing an insulative protecting layer between an element and a liquid or a gas for sealing, an oxygen absorber and al dehydrating agent are not directly contacted with the element so that damage of the element or wetting to the element by the liquid caused by the damage can be prevented. Oxygen or water dissolved in a sealing agent or existing in the element can be absorbed by the oxygen absorber or the dehydrating agent whereby damage of the element can be suppressed. Further, by providing a heat dissipation structure, deterioration of the material due to heat generating at driving the element can be prevented. By having such constitutions, generation and growth of dark spot in the organic EL element can be suppressed so that a lifetime of the element can be elongated.

What is claimed is:

1. An organic electroluminescent element comprising:
   a pair of electrodes sandwiching a laminated structure including an organic luminescent material therebetween to provide a organic electroluminescent element body;
   a case for sealing said element body therein; an inert medium filled in said case; and an insulative protecting layer provided on a cathode of said electrodes so as to isolate said cathode from said inert medium.

2. An organic electroluminescent element according to claim 1, wherein said protecting layer is made of a polymer of fluorine system.

3. An organic electroluminescent element according to claim 1, wherein said protecting layer is made of an oxide material.

4. An organic electroluminescent element according to claim 1, wherein said case has a cap portion made of a metal having good thermal conductivity and a substrate portion supporting said element body, and a low melting point glass is provided at a contacting portion between said cap portion and said substrate portion for sealing therebetween.

5. An organic electroluminescent element according to claim 1, further comprising a non-corrosive metal heat dissipation panel or net covering at least directly above said element body.

6. An organic electroluminescent element according to claim 1, wherein said inert medium contains an oxygen absorber and a dehydrating agent.

7. An organic electroluminescent element according to claim 6, wherein said oxygen absorber and said dehydrating agent are formulated into a sheet state or a solid state and provided so as not to contact with said element body.

8. An organic electroluminescent element according to claim 6, wherein said oxygen absorber is a member selected from the group consisting of fine powder of ascorbic acid, iron titanium and an oxide thereof and a metal salt thereof.

9. An organic electroluminescent element according to claim 6, wherein said dehydrating agent is at least one of silica gel and Molecular sieve.

* * * * *